(12) United States Patent
Nakamura et al.

(10) Patent No.: US 11,070,163 B2
(45) Date of Patent: Jul. 20, 2021

(54) DRIVING POWER SUPPLY DEVICE

(71) Applicant: AISIN AW CO., LTD., Anjo (JP)

(72) Inventors: Yasushi Nakamura, Nishio (JP); Keita Mutsuura, Miyoshi (JP); Yoshinobu Ito, Anjo (JP); Shota Sekiguchi, Inazawa (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 16/637,805

(22) PCT Filed: Sep. 20, 2018

(86) PCT No.: PCT/JP2018/034859
§ 371 (c)(1),
(2) Date: Feb. 10, 2020

(87) PCT Pub. No.: WO2019/059292
PCT Pub. Date: Mar. 28, 2019

(65) Prior Publication Data
US 2020/0220489 A1 Jul. 9, 2020

(30) Foreign Application Priority Data
Sep. 20, 2017 (JP) .............................. JP2017-180145

(51) Int. Cl.
*H02P 27/06* (2006.01)
*H02P 29/50* (2016.01)

(52) U.S. Cl.
CPC .............. *H02P 29/50* (2016.02); *H02P 27/06* (2013.01)

(58) Field of Classification Search
CPC .......... H02M 7/003; H02M 1/14; H02M 1/44; H02M 1/084; H02P 27/06; H02P 29/50
See application file for complete search history.

(56) References Cited

U.S. PATENT DOCUMENTS 4,150,425 A * 4/1979 Frosch .................... H02J 1/102
 363/56.06
6,282,102 B1 * 8/2001 Minamisawa ........ H02M 3/335
 363/16

(Continued)

FOREIGN PATENT DOCUMENTS

JP 2009-130967 A 6/2009

OTHER PUBLICATIONS

International Search Report for PCT/JP2018/034859, dated Nov. 13, 2018.

(Continued)

*Primary Examiner* — Rina I Duda
(74) *Attorney, Agent, or Firm* — Sughrue Mion, PLLC

(57) ABSTRACT

An amplitude of current ripples on a primary side of a power supply device that uses a plurality of transformers is reduced. A driving power supply device (7) that supplies electric power to a plurality of drive circuits (2) that individually drive switching elements (3) of an inverter (10) includes a plurality of transformers (L) having secondary-side coils (Ls) which are individually connected to the respective corresponding drive circuits (2); a plurality of transformer driving units (5) each including a driving switching element (M) that controls supply of electric power to a primary-side coil (Lp); and a power supply control device (6) that provides transformer drive signals (MG) for driving the transformer driving units (5). The power supply control device (6) drives the transformer driving units (5) by transformer drive signals (MG) having different phases.

15 Claims, 8 Drawing Sheets

(56) References Cited

U.S. PATENT DOCUMENTS

| | | | |
|---|---|---|---|
| 2009/0174353 A1 | 7/2009 | Nakamura et al. | |
| 2010/0302820 A1* | 12/2010 | Nakamura | H02M 1/08 363/126 |
| 2015/0364984 A1* | 12/2015 | Miyauchi | H02M 7/5387 363/132 |
| 2016/0329823 A1* | 11/2016 | Nakamura | H02M 1/08 |

OTHER PUBLICATIONS

Supplementary European Search Report dated Jun. 17, 2020, from the European Patent Office in Application No. 18859203.4.

* cited by examiner

DRIVING POWER SUPPLY DEVICE

CROSS REFERENCE TO RELATED APPLICATIONS

This application is a National Stage of International Application No. PCT/JP2018/034859 filed Sep. 20, 2018, claiming priority based on Japanese Patent Application No. 2017-180145 filed Sep. 20, 2017.

TECHNICAL FIELD

The present disclosure relates to a driving power supply device that supplies electric power to a plurality of drive circuits that individually drive switching elements of an inverter.

BACKGROUND ART

For example, a signal for driving an inverter that converts electric power between a high direct-current voltage such as that exceeding 100 volts and alternating current (a control signal for a switching element) is generated by a control circuit that operates at a much lower voltage (e.g., on the order of 3.3 to 5 volts) than the inverter. Hence, the control signal generated by the control circuit which is a low-voltage system circuit is transmitted, via a drive circuit belonging to a high-voltage system circuit, to the inverter which is the high-voltage system circuit as well. In many cases, the high-voltage system circuit and the low-voltage system circuit are isolated from each other.

For example, an inverter that includes a bridge circuit and converts electric power between three-phase alternating current and direct current generally includes six switching elements (two upper and lower stages×three phases). In this case, six drive circuits are also provided to drive the switching elements. Electric power is supplied to the six drive circuits from power supply circuits that are independent of each other. For example, FIG. 3, etc., of JP 2009-130967 A show a mode in which electric power is supplied to six drive circuits from a switching power supply that uses six transformers whose secondary-side coils are independent of each other. The switching power supply is of a push-pull type, and two transistors are connected to all primary-side coils of the six transformers in a shared manner. Switching control of the transistors is complementarily performed by a control circuit to drive the transformers.

In the switching power supply, switching control of the six transformers is performed in the same manner by the common transistors. Hence, the voltage waveforms and current waveforms on an input side of the respective transformers change in the same manner. Therefore, there is a tendency that the amplitude of current ripples on the input side becomes large. In many cases, a filter circuit that uses a capacitor, etc., is connected to a power supply connected to the primary-side coils in order to suppress the amplitude of current ripples. If the amplitude of current ripples is large, then there is a possibility of an increase in the size of the filter circuit.

CITATIONS LIST

Patent Literature

Patent Literature 1: JP 2009-130967 A

SUMMARY OF DISCLOSURE

Technical Problems

In view of the above-described background, it is desired to reduce the amplitude of current ripples on a primary side of a power supply device that uses a plurality of transformers.

Solutions to Problems

In one aspect, a driving power supply device in view of the above description that supplies electric power to a plurality of drive circuits that individually drive a plurality of switching elements included in an inverter that converts electric power between direct current and alternating current of a plurality of phases includes:

a plurality of transformers each including a primary-side coil and a secondary-side coil coupled to the primary-side coil in an electrically isolated state, the secondary-side coils being individually connected to the respective corresponding drive circuits;

a plurality of transformer driving units each including a driving switching element that is connected to a corresponding one of the primary-side coils and controls supply of electric power to the corresponding one of the primary-side coils; and a power supply control device that provides transformer drive signals for driving the transformer driving units, and the power supply control device drives the transformer driving units by the transformer drive signals having different phases.

According to this configuration, since the plurality of transformers are driven by transformer drive signals having different phases, timing at which a current ripple occurs in current on an input side varies between the transformers. That is, by breaking up the timing at which current ripples occur, the maximum amplitude of current ripples decreases. Namely, according to this configuration, the amplitude of current ripples on the primary side of the power supply device that uses the plurality of transformers can be reduced. As a result, for example, the size of a filter circuit that uses a capacitor or the like that smooths out ripples and thereby smooths voltage on the primary side can also be reduced.

Further features and advantages of the driving power supply device will become apparent from the following description of an embodiment which will be described with reference to drawings.

DESCRIPTION OF EMBODIMENTS

Figure 1:
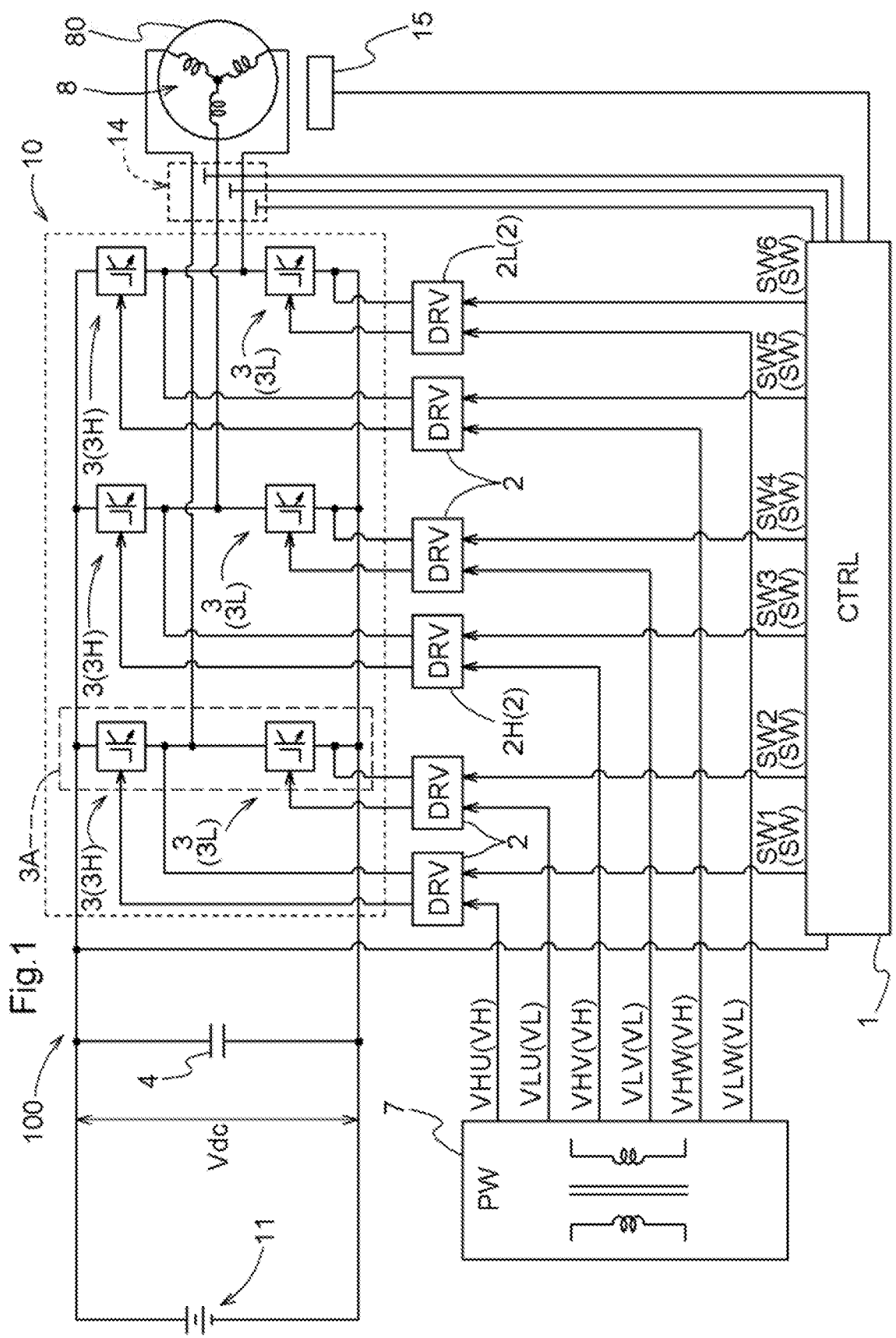
FIG. 1 is a schematic circuit block diagram of a rotating electrical machine driving device including a driving power supply circuit.

An embodiment of a driving power supply device will be described below based on the drawings, using, as an example, a mode in which the driving power supply device is applied to a rotating electrical machine driving device. A circuit block diagram of FIG. 1 schematically shows a system configuration of a rotating electrical machine driving device 100. The rotating electrical machine driving device 100 drives a rotating electrical machine 80 through an inverter 10 that is connected to a direct-current power supply 11 (high-voltage direct-current power supply) and converts electric power between direct-current electric power and alternating-current electric power of a plurality of phases. As shown in FIG. 1, the inverter 10 includes a plurality of (here, three) arms 3A each for one alternating-current phase. Each arm 3A includes a series circuit of an upper-stage-side switching element 3H and a lower-stage-side switching element 3L. The inverter 10 converts direct-current electric power to alternating-current electric power of a plurality of phases (n phases with n being a natural number; here, three phases), and supplies the alternating-current electric power to the rotating electrical machine 80. In the present embodiment, the inverter 10 is formed as a bridge circuit in which one series circuit (arm 3A) is provided for each of stator coils 8 for the U-, V-, and W-phases of the rotating electrical machine 80.

Note that the rotating electrical machine 80 may function as a generator. When the rotating electrical machine 80 also functions as a generator, alternating-current electric power generated by the rotating electrical machine 80 is converted to direct-current electric power, and the direct-current electric power is supplied to the direct-current power supply 11. It is preferred that the direct-current power supply 11 be formed of a secondary battery (battery) such as a nickel-hydrogen battery or a lithium-ion battery, an electric double-layer capacitor, etc.

The rotating electrical machine 80 can serve as, for example, a drive power source for a vehicle such as a hybrid vehicle or an electric vehicle. When the rotating electrical machine 80 is a drive power source for a vehicle, the voltage on a direct-current side of the inverter 10 (direct-current link voltage Vdc) is, for example, 200 to 400 volts. On the direct-current side of the inverter 10 there is provided a smoothing capacitor (direct-current link capacitor 4) that smooths the direct-current link voltage Vdc which fluctuates according to fluctuations in the power consumption of the rotating electrical machine 80.

As shown in FIG. 1, the inverter 10 is configured to include a plurality of switching elements 3. For the switching elements 3, it is preferred to apply power semiconductor devices such as Insulated Gate Bipolar Transistors (IGBTs), power Metal Oxide Semiconductor Field Effect Transistors (MOSFETs), Silicon Carbide-Metal Oxide Semiconductor FETs (SiC-MOSFETs), SiC-Static Induction Transistors (SiC-SITs), and Gallium Nitride-MOSFETs (GaN-MOSFETs). As shown in FIG. 1, the present embodiment exemplifies a mode in which IGBTs are used as the switching elements 3. Note that a freewheeling diode (not shown) is provided in parallel to each switching element 3, with a direction going from a negative polarity to a positive polarity (a direction going from a lower-stage side to an upper-stage side) being a forward direction.

The inverter 10 is controlled by an inverter control device (CTRL) 1. The inverter control device 1 is constructed using a logic processor such as a microcomputer as a core member. For example, the inverter control device 1 controls the rotating electrical machine 80 through the inverter 10 by performing current feedback control using a vector control method, based on target torque of the rotating electrical machine 80 which is provided from another control device such as a vehicle ECU which is not shown. Actual currents flowing through the stator coils 81 for the respective phases of the rotating electrical machine 80 are detected by a current sensor 14, and the inverter control device 1 obtains results of the detection. In addition, a magnetic pole position and a rotational speed at each time point of a rotor of the rotating electrical machine 80 are detected by a rotation sensor 15 such as a resolver, and the inverter control device 1 obtains results of the detection.

The inverter control device 1 performs current feedback control using, for example, a vector control method and using the results of detection obtained by the current sensor 14 and the rotation sensor 15. The inverter control device 1 is configured to include various functional parts for motor control, and each functional part is implemented by coordination of hardware such as a microcomputer and software (program). The vector control and current feedback control are publicly known and thus a detailed description thereof is omitted here.

Meanwhile, a control terminal of each switching element 3 (e.g., a gate terminal of an IGBT) included in the inverter 10 is connected to the inverter control device 1 through a drive circuit (DRV) 2, and switching control of the switching elements 3 is individually performed. The inverter control device 1 that generates switching control signals SW (SW1 to SW6) is an electronic circuit using a microcomputer or the like as a core, and is formed as a low-voltage system circuit. The low-voltage system circuit significantly differs in operating voltage (circuit power supply voltage) from a high-voltage system circuit such as the inverter 10. In many cases, on the vehicle there is mounted not only the direct-current power supply 11 but also a low-voltage direct-current power supply (not shown) which is a power supply with a lower voltage (e.g., 12 volts to 24 volts) than the direct-current power supply 11. The operating voltage of the inverter control device 1 is, for example, 5 volts or 3.3 volts, and the inverter control device 1 operates by being supplied with electric power from a power supply circuit such as a voltage regulator (not shown) that generates such an operating voltage, based on electric power of the low-voltage direct-current power supply.

As described above, the low-voltage system circuit significantly differs in operating voltage (circuit power supply voltage) from the high-voltage system circuit such as the inverter 10. Hence, the rotating electrical machine driving device 100 includes the drive circuits 2 each amplifying electric power of a switching control signal SW provided to a corresponding switching element 3 (a gate drive signal when the switching element 3 is a MOSFET or an IGBT). In other words, each drive circuit 2 improves driving capabilities (capabilities to allow a circuit at a subsequent stage to operate, e.g., voltage amplitude and output current) of a switching control signal SW, and transmits the switching control signal SW to a corresponding switching element 3.

The drive circuits 2 are provided for the respective switching elements 3. As shown in FIG. 1, in the present embodiment, the inverter 10 includes six switching elements 3 to be driven, and six drive circuits 2 are also provided. The drive circuits 2 include upper-stage-side drive circuits 2H that transmit switching control signals SW to the upper-stage-side switching elements 3H, and lower-stage-side drive circuits 2L that transmit switching control signals SW to the lower-stage-side switching elements 3L, but when the drive circuits 2 do not need to be particularly distinguished from each other, they will be simply described as the drive circuits 2.

Figure 2:
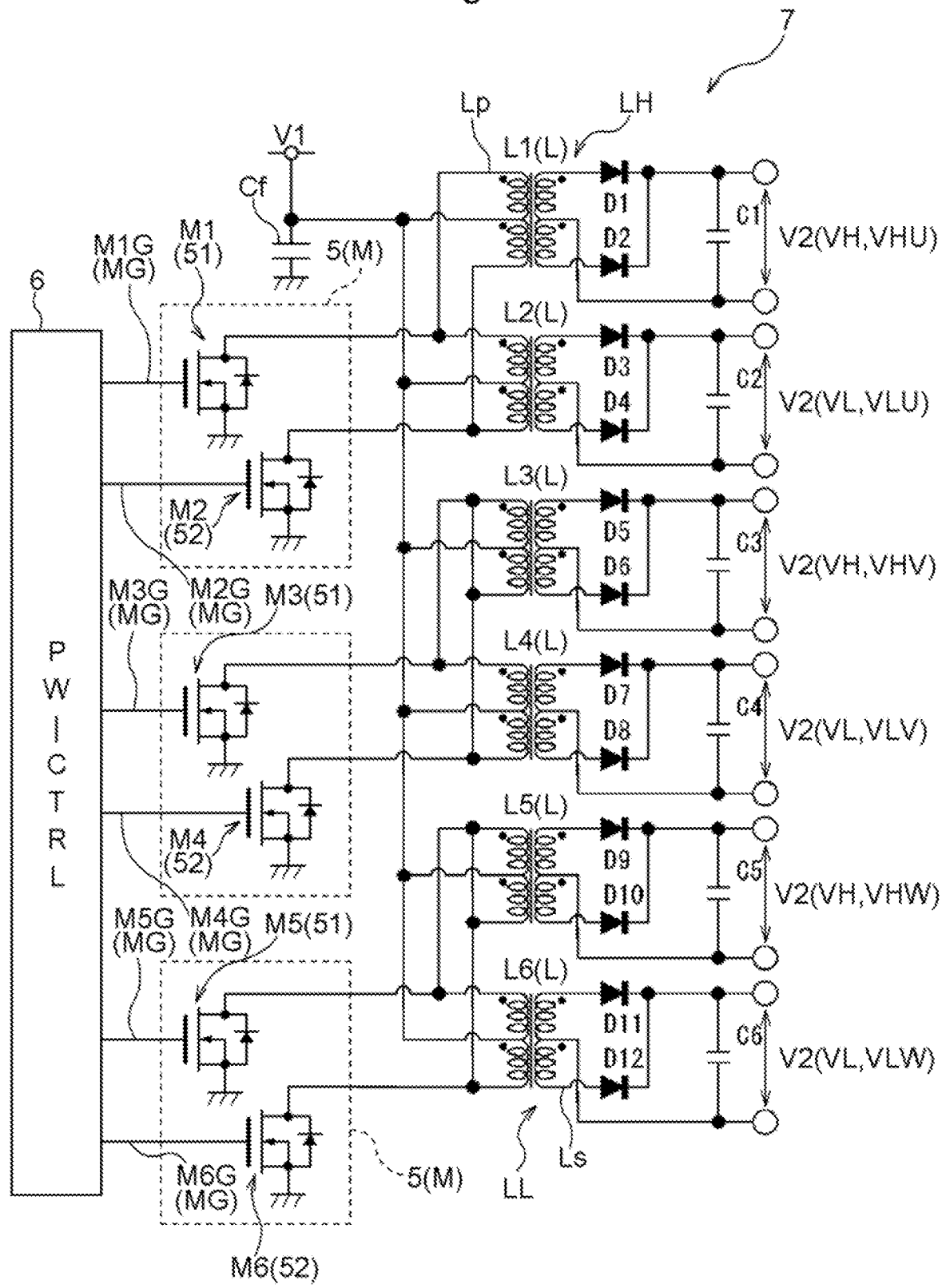
FIG. 2 is a schematic circuit block diagram of the driving power supply circuit.

The drive circuits 2 require a higher operating voltage than the low-voltage system circuit. To supply electric power to the drive circuits 2, a driving power supply circuit (PW) 7 (driving power supply device) is provided. FIG. 2 shows an example of the driving power supply circuit 7. The driving power supply circuit 7 includes six transformers L for the six switching elements 3 and the six drive circuits 2. Specifically, the driving power supply circuit 7 includes three upper-stage transformers LH (a U-phase upper-stage transformer L1, a V-phase upper-stage transformer L3, and a W-phase upper-stage transformer L5); and three lower-stage transformers LL (a U-phase lower-stage transformer L2, a V-phase lower-stage transformer L4, and a W-phase lower-stage transformer L6). The transformers (L1 to L6) all have the same configuration, and output secondary voltages of substantially the same voltage (output voltages V2) (a U-phase upper-stage drive voltage VHU, a U-phase lower-stage drive voltage VLU, a V-phase upper-stage drive voltage VHV, a V-phase lower-stage drive voltage VLV, a W-phase upper-stage drive voltage VHW, and a W-phase lower-stage drive voltage VLW). When upper-stage drive voltages and lower-stage drive voltages for the respective phases are collectively referred to, they are referred to as upper-stage drive voltages VH and lower-stage drive voltages VL.

Note that an input voltage V1 on a primary side of each transformer L is supplied from a power supply circuit which is stabilized by a voltage regulator, etc., and thus, without feedbacking an output voltage V2 on a secondary side to the primary side, the output voltage V2 on the secondary side is determined by a transformer ratio of the transformer L. In addition, D1 to D12 are rectification diodes that rectify alternating currents generated in secondary-side coils Ls, and C1 to C6 are smoothing capacitors that smooth waveforms obtained after the rectification.

Figure 6:
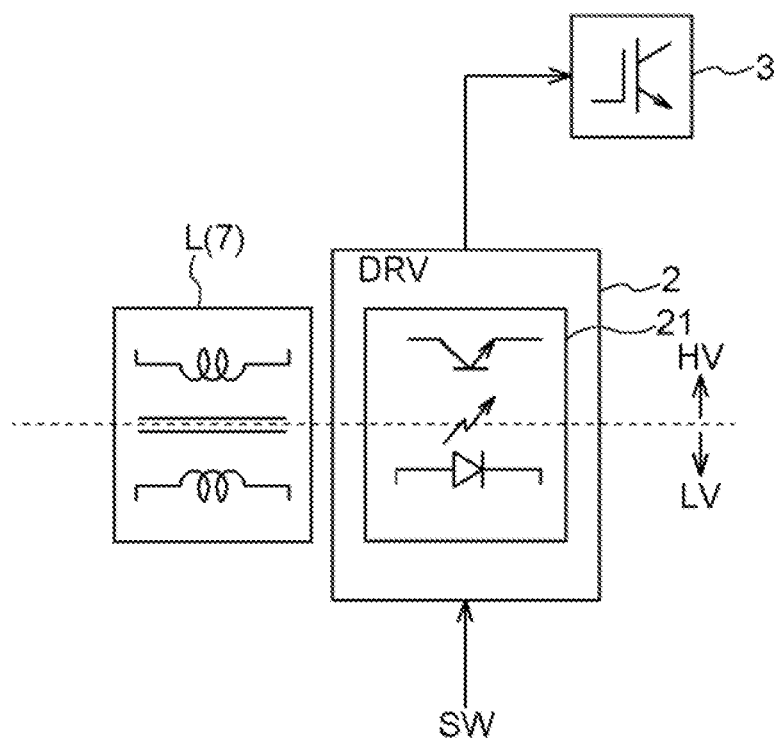
FIG. 6 is a schematic block diagram showing an exemplary configuration of a drive circuit.

Primary-side coils Lp of the respective transformers L belong to the low-voltage system circuit LV, and the secondary-side coils Ls belong to the high-voltage system circuit HV. That is, the transformers L are disposed at a boundary portion between the low-voltage system circuit LV and the high-voltage system circuit HV, and connect the low-voltage system circuit LV to the high-voltage system circuit HV in an isolated state (see FIG. 6). Note that each drive circuit 2 also includes, as shown in FIG. 6, an insulating element 21 that transmits a signal in an electrically isolated state, such as a photocoupler that transmits a signal by light or a magnetic coupler that transmits a signal by magnetism. The insulating element 21 is also disposed at the boundary portion between the low-voltage system circuit LV and the high-voltage system circuit HV.

As shown in FIG. 2, to each primary-side coil Lp is connected a driving switching element M that switches voltage applied to the primary-side coil Lp. Here, a push-pull type switching power supply circuit is exemplified, and two driving switching elements M (a first switching element 51 and a second switching element 52) whose switching control is complementarily performed are connected to each primary-side coil Lp. Switching control of the driving switching elements M (the first switching element 51 and the second switching element 52) is performed by a power supply control circuit (PW-CTRL) 6. As shown in FIG. 2, in the present embodiment, a transformer driving unit 5 that controls the supply of electric power to primary-side coils Lp is configured to include two driving switching elements M: a first switching element 51 and a second switching element 52.

In the present embodiment, the six transformers L are grouped into three sets of transformer pairs for the respective phases of three-phase alternating current. That is, the three sets include a transformer pair (L1 and L2) for the U-phase, a transformer pair (L3 and L4) for the V-phase, and a transformer pair (L5 and L6) for the W-phase. Each transformer pair is driven by a common transformer driving unit 5 (driving switching elements M). The transformer pair (L1 and L2) for the U-phase is driven by a U-phase first switching element M1 and a U-phase second switching element M2, the transformer pair (L3 and L4) for the V-phase is driven by a V-phase first switching element M3 and a V-phase second switching element M4, and the transformer pair (L5 and L6) for the W-phase is driven by a W-phase first switching element M5 and a W-phase second switching element M6.

Figure 3:
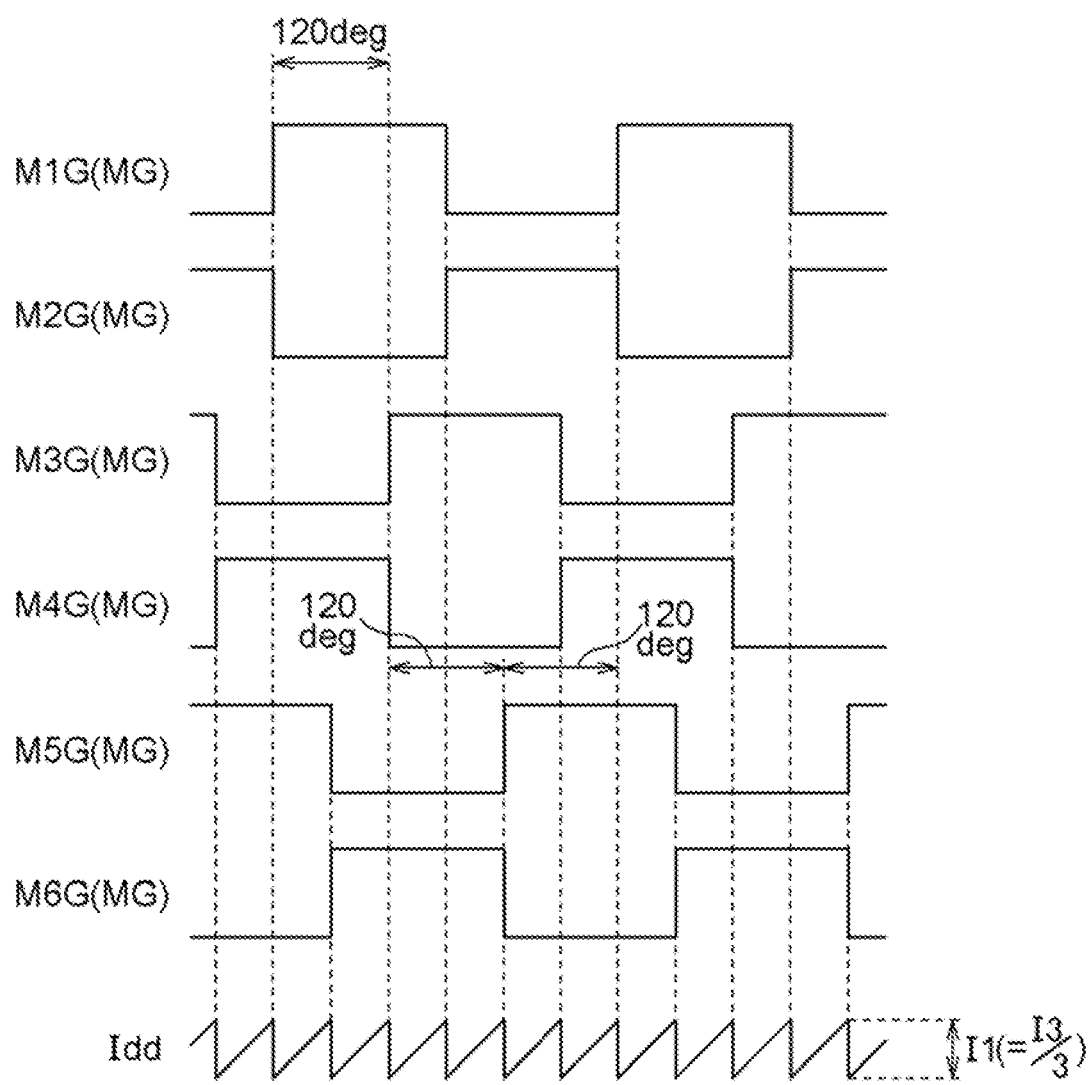
FIG. 3 is a schematic waveform diagram showing a relationship between transformer drive signals and current ripples.

As described above, switching control of a pair of driving switching elements M in a transformer driving unit 5, i.e., a first switching element 51 and a second switching element 52 (a pair of M1 and M2, a pair of M3 and M4, and a pair of M5 and M6), is complementarily performed. A waveform diagram of FIG. 3 schematically shows transformer drive signals MG for performing switching control of the driving switching elements M. M1G is a U-phase first switching element drive signal for driving the U-phase first switching element M1, and M2G is a U-phase second switching element drive signal for driving the U-phase second switching element M2. The other M3G, M4G, M5G, and M6G are transformer drive signals for driving the V-phase first switching element M3, the V-phase second switching element M4, the W-phase first switching element M5, and the W-phase second switching element M6, respectively, and are a V-phase first switching element drive signal, a V-phase second switching element drive signal, a W-phase first switching element drive signal, and a W-phase second switching element drive signal, respectively.

The logic of the U-phase second switching element drive signal M2G is inverted with respect to that of the U-phase first switching element drive signal M1G. When the U-phase first switching element drive signal M1G is a forward signal, the U-phase second switching element drive signal M2G is a reverse signal. That is, the U-phase first switching element drive signal M1G and the U-phase second switching element drive signal M2G are a pair of forward and reverse transformer drive signals MG whose phases are different by 180° from each other. Likewise, the V-phase first switching element drive signal M3G and the V-phase second switching element drive signal M4G are also inverted in logic, and are a pair of forward and reverse transformer drive signals MG whose phases are different by 180° from each other. In addition, the W-phase first switching element drive signal M5G and the W-phase second switching element drive signal M6G are also inverted in logic, and are a pair of forward and reverse transformer drive signals MG whose phases are different by 180° from each other.

The U-phase first switching element drive signal M1G and the V-phase first switching element drive signal M3G are different in phase by 120° from each other, and the V-phase first switching element drive signal M3G and the W-phase first switching element drive signal M5G are also different in phase by 120° from each other, and furthermore, the W-phase first switching element drive signal M5G and the U-phase first switching element drive signal M1G are also different in phase by 120° from each other. Likewise, the U-phase second switching element drive signal M2G and the V-phase second switching element drive signal M4G are different in phase by 120° from each other, and the V-phase second switching element drive signal M4G and the W-phase second switching element drive signal M6G are also different in phase by 120° from each other, and furthermore, the W-phase second switching element drive signal M6G and the U-phase second switching element drive signal M2G are also different in phase by 120° from each other.

In the present embodiment, the driving power supply circuit 7 includes three sets of transformer driving units 5 each including a pair of driving switching elements M: a first switching element 51 and a second switching element 52 whose switching control is complementarily performed by a pair of forward and reverse transformer drive signals having common change points. The sets of transformer driving units 5 are driven by three types of pairs of forward and reverse transformer drive signals whose phases are different by 120° (=360°/three sets) from each other. That is, a pair of forward and reverse transformer drive signals MG including the U-phase first switching element drive signal M1G and the U-phase second switching element drive signal M2G, a pair of forward and reverse transformer drive signals MG including the V-phase first switching element drive signal M3G and the V-phase second switching element drive signal M4G, and a pair of forward and reverse transformer drive signals MG including the W-phase first switching element drive signal MSG and the W-phase second switching element drive signal M6G are different in phase by 120° (=360°/three sets) from each other.

As such, the driving power supply circuit 7 is configured to include the plurality of transformers L each including a primary-side coil Lp and a secondary-side coil Ls coupled to the primary-side coil Lp in an electrically isolated state, the secondary-side coils Ls being individually connected to their respective corresponding drive circuits 2. In addition, the plurality of transformer driving units 5 each including driving switching elements M that control the supply of electric power to their corresponding primary-side coils Lp are connected to the primary-side coils Lp of their corresponding transformers L. The power supply control device 6 provides transformer drive signals MG that drive the transformer driving units 5, such that the transformer drive signals MG have different phases.

As exemplified with reference to FIGS. 2 and 3, in the present embodiment, m sets of transformer driving units 5 (m is a natural number greater than or equal to 2; here m=3) are provided, each set of transformer driving units 5 being driven by transformer drive signals MG having common change points (M1G and M2G, M3G and M4G, and M5G and M6G). The sets of transformer driving units 5 are driven by transformer drive signals MG whose phases are different from each other by a phase (=120°) which is obtained by dividing the phase of one cycle of electrical angle (360°) by the number m of sets (here, three). Note that the present embodiment exemplifies a mode in which three transformer driving units 5 are provided, and one set of transformer driving units 5 is formed of one transformer driving unit 5. As a matter of course, one set of transformer driving units 5 may be formed of a plurality of transformer driving units 5. For example, a mode may be employed in which six transformer driving units 5 are provided, and one set of transformer driving units 5 is formed of two transformer driving units 5, providing three sets.

In the present embodiment, the six transformers L are grouped into three sets (m sets) of transformer pairs for the respective phases of three-phase alternating current (n-phase alternating current) (m=n). Therefore, it can also be said that the transformer driving units 5 (a unit of M1 and M2, a unit of M3 and M4, and a unit of M5 and M6) for the respective phases are driven by transformer drive signals MG having a phase difference (=120°) which is obtained by dividing the phase of one cycle of electrical angle (360°) by the number n of phases (here, three). Alternatively, it can also be said that grouping is performed using the number n of phases as the number m of sets.

When the plurality of transformers L are thus driven by transformer drive signals MG having different phases, as shown in FIG. 3, timing at which a current ripple occurs in input current Idd on the primary side varies between the transformers L. That is, by breaking up the timing at which the input current Idd ripples, a maximum peak-to-peak I1 of ripples in the input current Idd decreases. Therefore, the maximum amplitude of current ripples on the primary side of the driving power supply circuit 7 that uses the plurality of transformers L can be reduced. As a result, for example, the size of a filter circuit that uses a filter capacitor Cf or the like that smooths out ripples in the input current Idd and thereby smooths voltage on the primary side can also be reduced.

Figure 4:
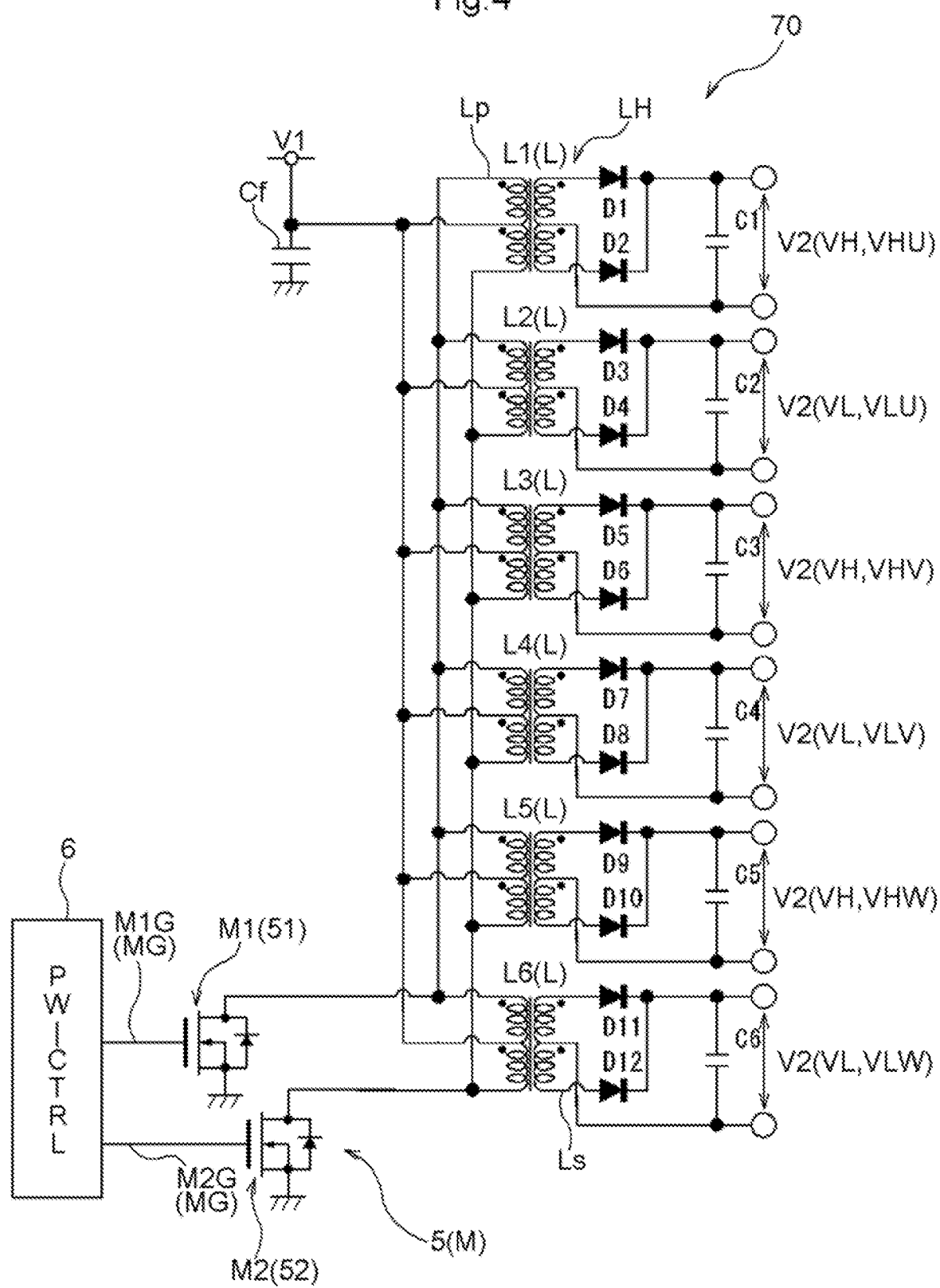
FIG. 4 is a schematic circuit block diagram of a driving power supply circuit of a comparative example.
Figure 5:
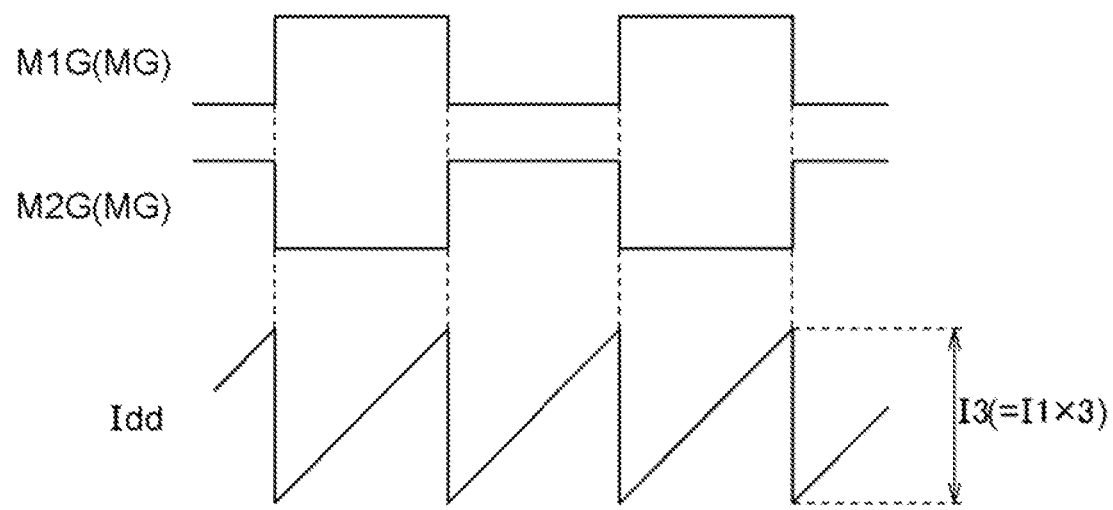
FIG. 5 is a schematic waveform diagram showing a relationship between transformer drive signals and current ripples in the comparative example.

Description will be made below with reference also to a driving power supply circuit 70 of a comparative example. A circuit block diagram of FIG. 4 schematically shows the driving power supply circuit 70 of the comparative example. In addition, a waveform diagram of FIG. 5 shows a relationship between transformer drive signals MG that control the driving power supply circuit 70 of the comparative example and input current Idd. The same configurations as those of the driving power supply circuit 7 of the present embodiment are denoted by the same reference signs, and description thereof is omitted as appropriate. As shown in FIG. 4, in the comparative example, six transformers L are all driven through the same transformer driving unit 5 without being grouped into a plurality of sets. Therefore, as shown in FIG. 5, for all transformers L, the transformer drive signals MG are signals of the same phases.

In the case of the driving power supply circuit 70 of the comparative example, the plurality of transformers L are driven by the transformer drive signals MG of the same phases. Hence, as shown in FIG. 5, timing at which the input current Idd ripples on an input side does not vary between the transformers L, and is the same for all transformers L. As a result, the timing at which the input current Idd ripples is not broken up, and a maximum peak-to-peak I3 of current ripples is larger than the maximum peak-to-peak I1 exemplified in FIG. 3. In the present embodiment, the timing at which the input current Idd ripples is broken up into three timings, by which comparing to the comparative example in which the timings are brought together, the maximum peak-to-peak I1 is reduced to ⅓ (I1=I3/3).

In the present embodiment, the maximum peak-to-peak is reduced to ⅓ that of the comparative example, by which the capacitance of the filter capacitor Cf that smooths the voltage on the primary side can be reduced, and the circuit size can also be reduced. Note that as is clear from the comparison of FIGS. 3 and 5, in the present embodiment, the frequency of current ripples is three times that of the comparative example. However, when the filter circuit is formed of a capacitor, the impedance of the capacitor is inversely proportional to frequency (with the frequency being f, the impedance is "½πf"). That is, when the frequency increases, the impedance decreases and thus ripple components are more easily smoothed out.

Meanwhile, the above description exemplifies a mode in which the transformers L are grouped into three sets, but as a matter of course, the number (m) of sets is not limited to three. For example, the transformers L may be divided into two sets: a set of upper-stage transformers LH and a set of lower-stage transformers LL. In addition, the transformers L may be divided into six sets in which all six transformers L belong to different groups.

Note, however, that when the number m of sets is two or six, unlike the case in which the number m of sets is three as described above, attention needs to be paid. As described above, with respect to one transformer drive signal MG (e.g., the U-phase first switching element drive signal M1G) for two driving switching elements M whose switching control is complementarily performed, the logic of the other transformer drive signal MG (e.g., the U-phase second switching element drive signal M2G) is inverted. It can be said that the phases of the pair of forward and reverse transformer drive signals MG are shifted by 180° relative to each other. Here, in a case of phases whose phase difference obtained by "360°/m" is a divisor of 180°, transformer drive signals MG with a phase shift of 180° are generated.

For example, a case in which the transformers L are divided into two sets (m=2) is considered. For convenience sake, here, M1G and M2G are a pair of forward and reverse transformer drive signals MG for a transformer driving unit 5 that drives three upper-stage transformers LH, and M3G and M4G are a pair of forward and reverse transformer drive signals MG for a transformer driving unit 5 that drives three lower-stage transformers LL. When, as in the case of m=3, the phase difference between a pair of M1G and M2G and a pair of M3G and M4G is 180° (360°/2), as shown in a waveform diagram of FIG. 7, the phases of M2G and M3G become identical.

Figure 8:
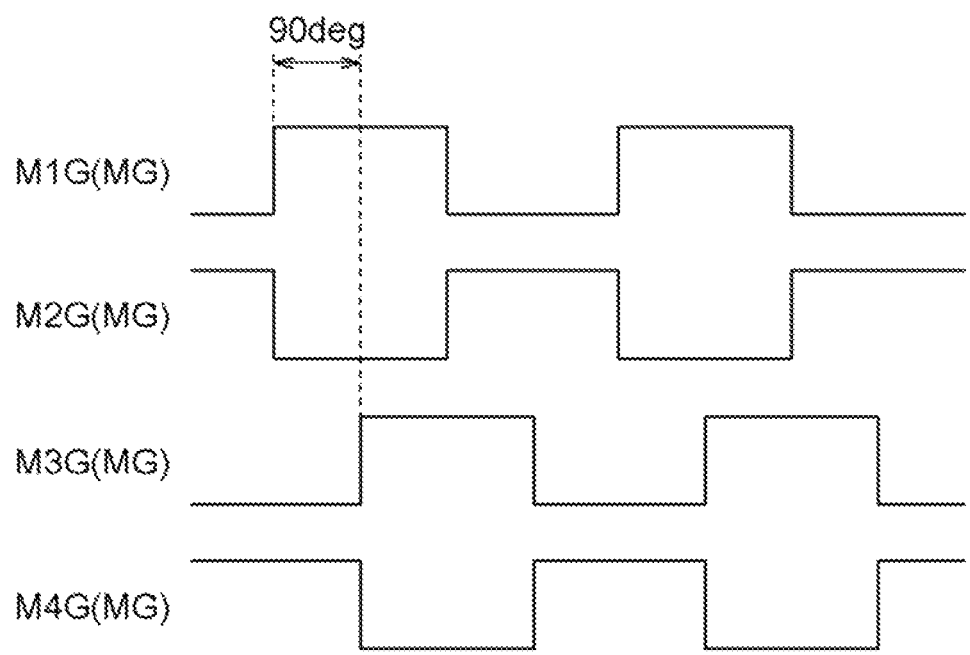
FIG. 8 is a schematic waveform diagram showing a relationship between transformer drive signals and current ripples.

Here, when, as shown in a waveform diagram of FIG. 8, the phase difference between the pair of M1G and M2G and the pair of M3G and M4G is 90°, as shown in the waveform diagram of FIG. 8, M1G, M2G, M3G, and M4G all have different phases. In addition, M1G, M2G, M3G, and M4G have equal phase differences. Therefore, when "360°/m" is a divisor of 180, it is desirable that the phases of a plurality of pairs of forward and reverse transformer drive signals MG be made different from each other in a range of 180°. Specifically, when "360°/m" is a divisor of 180, it is preferred that the sets of transformer driving units 5 be driven by pairs of forward and reverse transformer drive signals MG whose phases are different by "180°/m" from each other.

Figure 7:
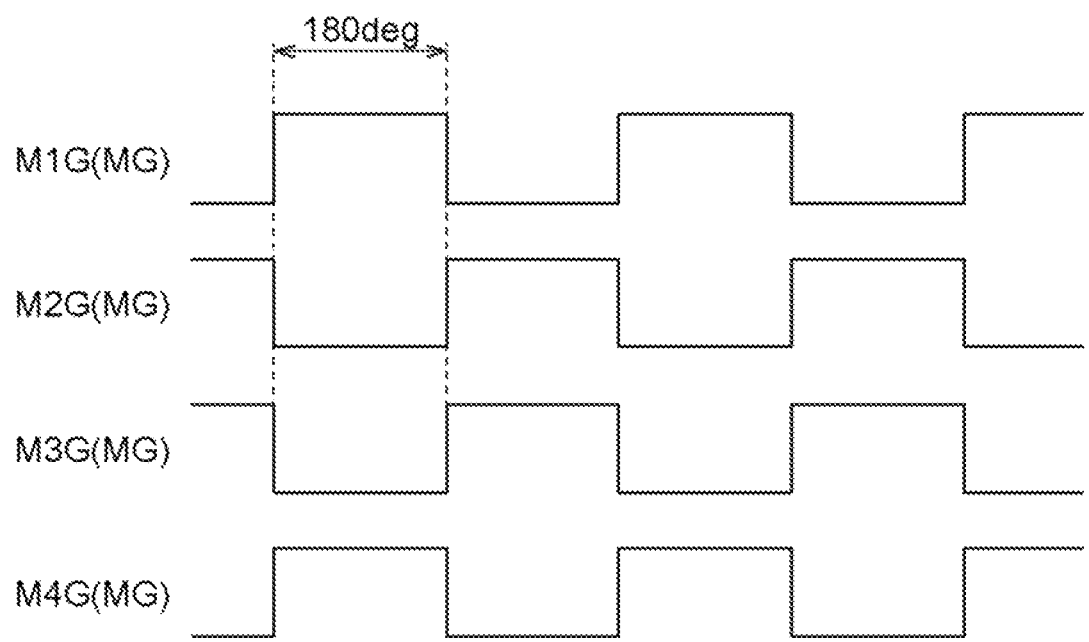
FIG. 7 is a schematic waveform diagram showing a relationship between transformer drive signals and current ripples.

When m=2, the phase difference is "180°/2=90°" and excellently matches with the results verified with reference to FIGS. 7 and 8. Though depiction, etc., are omitted, when the transformers L are divided into six sets (m=6), too, since "360/6=60" is a divisor of 180, it is desirable that the phase difference be "180°/6=30°". The number m of sets in which "360/m" is a divisor of 180 is a case in which m is a power of 2 such as m=4, 8, and 16, or m=10, 12, 18, etc., in addition to m=2 and 6.

Note that in a mode shown in FIG. 8 (m=2), the phases of the pair of M3G and M4G are delayed by 90° relative to the pair of M1G and M2G. On the other hand, when looking at this from a different perspective, it can also be said that the phases of the pair of M1G and M2G are delayed by 270° with respect to the pair of M3G and M4G. However, when viewed from the pair of M1G and M2G, the phases of the pair of M3G and M4G are different by 90° (in this case, delayed), and when viewed from the pair of M3G and M4G, the phases of the pair of M1G and M2G are also different by 90° (in this case, advanced), and thus, it can be said that the sets of transformer driving units 5 are driven by pairs of forward and reverse transformer drive signals MG whose phases are different by "(180°/m)=90°" from each other.

In addition, for example, when m=4, the phase delay and advance can be likewise represented by 45° (=180°/4). For example, a pair of forward and reverse transformer drive signals MG for a second set is delayed in phase by 45° with respect to a pair of forward and reverse transformer drive signals MG for a first set, a pair of forward and reverse transformer drive signals MG for a third set is delayed in phase by 45° with respect to the pair of forward and reverse transformer drive signals MG for the second set, and a pair of forward and reverse transformer drive signals MG for a fourth set is delayed in phase by 45° with respect to the pair of forward and reverse transformer drive signals MG for the third set. It can be said that the pair of forward and reverse transformer drive signals MG for the first set is delayed in phase by 225° or advanced in phase by 135° with respect to the pair of forward and reverse transformer drive signals MG for the fourth set. However, when considering the first set, the second set, the third set, and the fourth set in this order, the phases of the pairs of forward and reverse transformer drive signals MG are delayed (different) by 45° with respect to each other, and when considering the fourth set, the third set, the second set, and the first set in this order, the phases of the pairs of forward and reverse transformer drive signals MG are advanced (different) by 45° with respect to each other. Therefore, as in the case of m=2, it can be said that the sets of transformer driving units 5 are driven by pairs of forward and reverse transformer drive signals MG whose phases are different by "(180°/m)=45°" from each other. Though a detailed description is omitted, the same also applies to m=6, 8, 16, 0, 12, 18, etc.

Meanwhile, as described above with reference to FIG. 2, etc., in the present embodiment, the six transformers L are grouped into three sets of transformer pairs (a pair of L1 and L2, a pair of L3 and L4, and a pair of L5 and L6) for the respective phases of three-phase alternating current. The transformer pairs are controlled by different transformer driving units 5 (driving switching elements M). A transformer pair (L1 and L2) for the U-phase is controlled by a U-phase first switching element M1 and a U-phase second switching element M2, a transformer pair (L3 and L4) for the V-phase is controlled by a V-phase first switching element M3 and a V-phase second switching element M4, and a transformer pair (L5 and L6) for the W-phase is controlled by a W-phase first switching element M5 and a W-phase second switching element M6.

Figure 9:
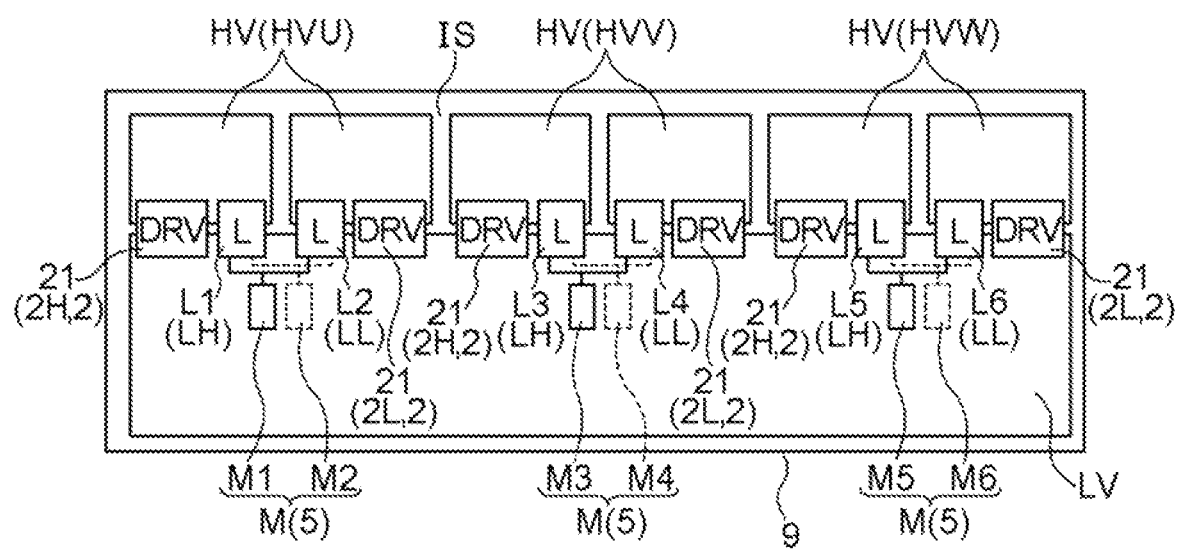
FIG. 9 is a diagram showing exemplary disposition of the driving power supply circuit and the drive circuits on a substrate.

An upper-stage-side switching element 3H and a lower-stage-side switching element 3L which are included in an arm 3A for each phase are generally disposed close to each other. FIG. 9 shows exemplary disposition of the driving power supply circuit 7 and the drive circuits 2 on a substrate. An upper-stage-side switching element 3H and a lower-stage-side switching element 3L for each phase are disposed in proximity to each other in disposition regions of the high-voltage system circuit HV. Transformers L for each phase do not supply electric power to other phases, and thus, can be disposed close to the phase. In addition, the transformers L for the phase are driven by driving switching elements M (transformer driving unit 5) different than those for transformers L that supply electric power to other phases. Therefore, as shown in FIG. 9, transformers L for each phase and driving switching elements M (transformer driving unit 5) for the transformers L can be disposed in proximity to each other on a substrate 9.

As a result, wiring lines between the driving switching elements M (transformer driving unit 5) and the transformers L (in FIG. 9, a solid line and a broken line that extend from two driving switching elements M (M1 and M2)) can be shortened. Ripples in the input current Idd propagate through the wiring lines. Hence, there is a possibility that electromagnetic noise caused by ripple components may be radiated from the wiring lines on the substrate 9, but comparing to a case of a long wiring line length, when the wiring line length is short, radiation of electromagnetic noise is reduced.

Figure 10:
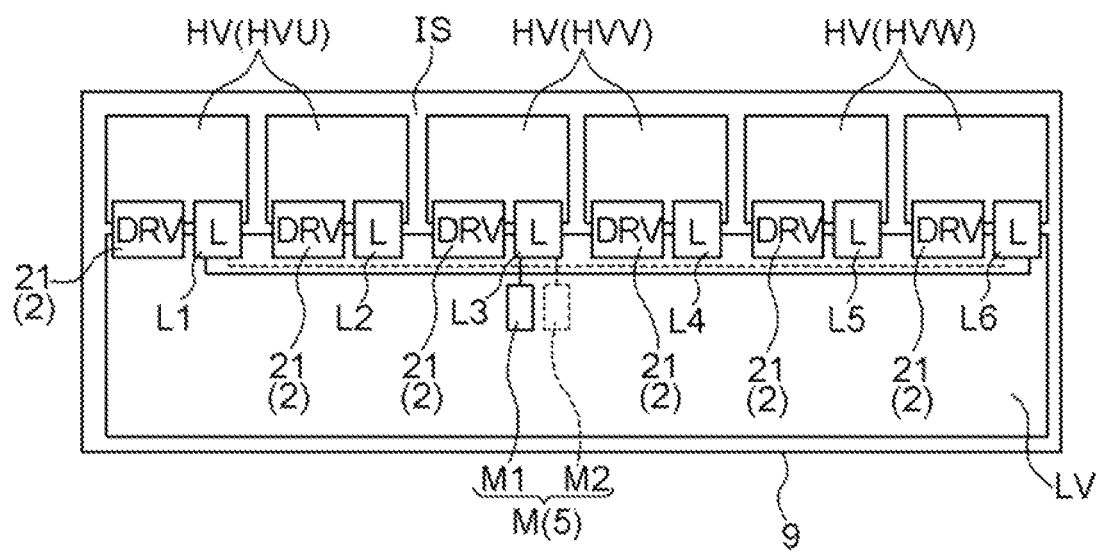
FIG. 10 is a diagram showing exemplary disposition of the driving power supply circuit and the drive circuits on a substrate in the comparative example.

FIG. 10 shows exemplary disposition of the driving power supply circuit 70 of the comparative example exemplified in FIG. 5 and the drive circuits 2 on a substrate. In the driving power supply circuit 70 of the comparative example, too, transformers L for each phase do not supply electric power to other phases, and thus, can be disposed close to the phase. However, the transformers L for the phase are driven by the same driving switching elements M (transformer driving unit 5) as those for transformers L that supply electric power to other phases. Therefore, wiring lines between the driving switching elements M (transformer driving unit 5) and the transformers L (in FIG. 10, a solid line and a broken line that extend from two driving switching elements M (M1 and M2)) are routed to all transformers L, and thus, there is a tendency that the wiring line length becomes long. As is clear from a comparison of FIGS. 9 and 10, the wiring line length between the driving switching elements M (transformer driving unit 5) and the transformers L is longer in the comparative example. When the wiring line length is long, there is a possibility that more electromagnetic noise caused by ripple components may be radiated from the wiring lines on the substrate 9.

Note that exemplary disposition of the driving power supply circuit 7 and the drive circuits 2 on the substrate is not limited to a mode in which, as exemplified in FIG. 9, the switching elements 3 included in the inverter 10 are arranged in a row. For example, as exemplified in FIG. 11, the switching elements 3 may be divided on a per alternating-current phase basis and disposed. When the six transformers L are grouped into sets of transformers L for the respective phases of three-phase alternating current, and the sets are controlled by different transformer driving units 5 (driving switching elements M), even if the switching elements 3 are thus divided on a per alternating-current phase basis and disposed, the wiring line length between the driving switching elements M (transformer driving unit 5) and the transformers L can be shortened.

Figure 11:
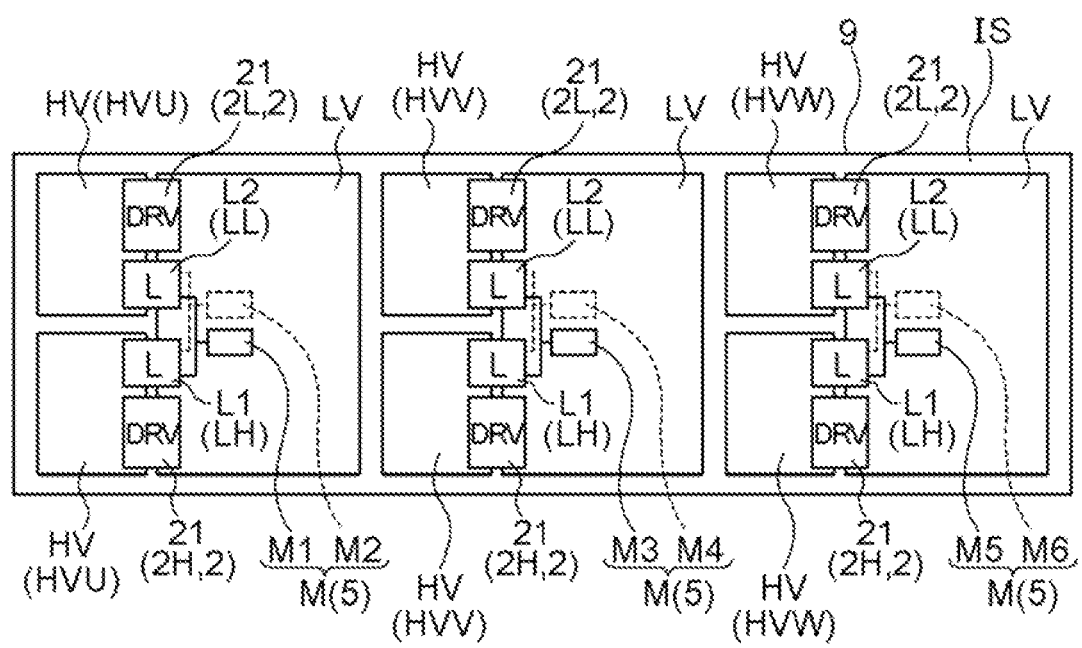
FIG. 11 is a diagram showing another exemplary disposition of the driving power supply circuit and the drive circuits on a substrate.

In addition, in both of a mode such as that exemplified in FIG. 9 and a mode such as that exemplified in FIG. 11, for all of the plurality of phases, the transformers L and the driving switching elements M (transformer driving units 5) do not need to be disposed in proximity to each other. If transformers L and driving switching elements M (transformer driving unit 5) for at least one of the plurality of phases are disposed in proximity to each other, then an advantageous effect of a reduction in electromagnetic noise can be obtained.

[Other Embodiments]

Other embodiments will be described below. Note that a configuration of each embodiment which will be described below is not limited to being applied alone, and can also be applied by being combined with a configuration of another embodiment as long as a contradiction does not arise.

(1) In the above description, a mode is exemplified in which the driving power supply circuit 7 is formed as a push-pull type switching power supply. However, the driving power supply circuit 7 may be of other types, e.g., a half-bridge type or full-bridge type switching power supply.

(2) In addition, the type of the driving power supply circuit 7 is not limited to one in which the transformer driving units 5 that drive the transformers L each include a plurality of driving switching elements M whose switching control is complementarily performed, such as a push-pull type, a half-bridge type, and a full-bridge type. The driving power supply circuit 7 may be a switching power supply of a single forward type or a flyback type in which a transformer driving unit 5 includes a single driving switching element M. Note that in this case, as a matter of course, a transformer drive signal MG that drives the transformer driving unit 5 (driving switching element M) is not a pair of forward and reverse signals but a single signal. Therefore, regardless of the number of sets (the number m of sets) into which the transformers L and the transformer driving units 5 are grouped, a phase difference that is set between a plurality of transformer drive signals MG is a value obtained by dividing 360° by the number m of sets. That is, in either of a case in which "360/m" is a divisor of 180 and a case in which "360/m" is not a divisor of 180, the sets of transformer driving units 5 are driven by transformer drive signals MG whose phases are different by "360°/n" from each other.

[Summary of the Embodiments]

A summary of a driving power supply device (7) described in the above description will be briefly described below.

In one aspect, a driving power supply device (7) that supplies electric power to a plurality of drive circuits (2) that individually drive a plurality of switching elements (3) included in an inverter (10) that converts electric power between direct current and alternating current of a plurality of phases includes: a plurality of transformers (L) each including a primary-side coil (Lp) and a secondary-side coil (Ls) coupled to the primary-side coil (Lp) in an electrically isolated state, the secondary-side coils (Ls) being individually connected to the respective corresponding drive circuits (2); a plurality of transformer driving units (5) each including a driving switching element (M) that is connected to a corresponding one of the primary-side coils (Lp) and controls supply of electric power to the corresponding one of the primary-side coils (Lp); and a power supply control device (6) that provides transformer drive signals (MG) for driving the transformer driving units (5), and the power supply control device (6) drives the transformer driving units (5) by the transformer drive signals (MG) having different phases.

According to this configuration, since the plurality of transformers (L) are driven by transformer drive signals (MG) having different phases, timing at which a current ripple occurs in current (Idd) on an input side varies between the transformers (L). By breaking up the timing at which current ripples occur, the maximum amplitude of current ripples decreases. Namely, according to this configuration, the amplitude of current ripples on the primary side of the power supply device that uses the plurality of transformers (L) can be reduced. As a result, for example, the size of a filter circuit that uses a capacitor (CO or the like that smooths out ripples and thereby smooths voltage on the primary side can also be reduced.

Here, it is preferred that m sets of the transformer driving units (5) (m is a natural number greater than or equal to 2) be provided, each set of the transformer driving units (5) being driven by the transformer drive signals (MG) having common change points, and the sets of the transformer driving units (5) be driven by the transformer drive signals (MG) whose phases are different by "360°/m" from each other.

In transformers (L) that are driven by transformer drive signals (MG) having common change points, a current ripple occurs at the same timing. On the other hand, in transformers (L) that are driven by transformer drive signals (MG) having different change points, a current ripple (Idd) occurs at different timings. The further the timings of peaks of current ripples occurring at different timings are off from each other, the smaller the maximum amplitude of the current ripples. According to this configuration, since the transformers (L) belonging to different sets have equal phase differences and are driven by transformer drive signals (MG) having different phases, the maximum amplitude of current ripples decreases and thus it is preferred.

Here, when each transformer driving unit (5) includes a pair of the driving switching elements (M) including a first switching element (51 (M1, M3, M5)) and a second switching element (52 (M2, M4, M6)) whose switching control is complementarily performed by a pair of the forward and reverse transformer drive signals (MG) having common change points, it is preferred that the sets of the transformer driving units (5) be driven as follows. Specifically, when "360/m" is a divisor of 180, it is preferred that the sets of the transformer driving units (5) be driven by pairs of the forward and reverse transformer drive signals (MG) whose phases are different by "180°/m" from each other. On the other hand, when "360/m" is other than a divisor of 180, it is preferred that the sets of the transformer driving units (5) be driven by pairs of the forward and reverse transformer drive signals (5) whose phases are different by "360°/m" from each other.

With respect to one transformer drive signal (MG) for two driving switching elements (M) whose switching control is complementarily performed, the logic of the other transformer drive signal (MG) is inverted. That is, switching control of two driving switching elements (M) whose switching control is complementarily performed is performed by a pair of forward and reverse transformer drive signals (MG) which is a pair of a forward signal and a reverse signal. It can be said that the phases of the pair of forward and reverse transformer drive signals (MG) are shifted by 180° relative to each other. In a case of phases whose phase difference obtained by "360°/m" is a divisor of 180°, transformer drive signals (MG) with a phase shift of 180° are generated. Specifically, a transformer drive signal (MG) which is a forward signal included in a pair of forward and reverse transformer drive signals (MG) and a transformer drive signal (MG) which is a reverse signal included in another pair of forward and reverse transformer drive signals (MG) match each other in phase. Therefore, when "360/m" is a divisor of 180, it is desirable that the phases of a plurality of pairs of forward and reverse transformer drive signals (MG) be made different from each other in a range of 180°. On the other hand, when "360/m" is other than a divisor of 180, transformer drive signals (MG) having a phase shift of 180° are not generated. Therefore, when "360/m" is other than a divisor of 180, it is desirable that the phases of a plurality of pairs of forward and reverse transformer drive signals (MG) be made different from each other in a range of 360°.

Here, it is preferred that the inverter (10) convert electric power between n-phase alternating current (n is a natural number greater than or equal to 2) and direct current, and a number m of sets of the transformer driving units (5) be n.

When the number of sets of transformer driving units (5), each set being driven by the transformer drive signals (MG) having common change points, matches the number of phases of alternating current of a plurality of phases, grouping is easy. In general, switching elements (3) for each phase are often disposed close to each other, and thus, by performing grouping phase-by-phase, efficient wiring on a substrate is also obtained.

In addition, in one aspect, when the inverter (10) includes a plurality of arms (3A) each for one alternating-current phase, each arm (3A) being a series circuit of an upper-stage-side switching element (3H) connected to a positive polarity side of direct current and a lower-stage-side switching element (3L) connected to a negative polarity side of direct current, and each transformer driving unit (5) includes a pair of the driving switching elements (M) including a first switching element (51 (M1, M3, M5)) and a second switching element (52 (M2, M4, M6)) whose switching control is complementarily performed, it is preferred that of the plurality of transformers (L), an upper-stage-side transformer (LH) and a lower-stage-side transformer (LL) for a same phase of alternating current be driven by the common transformer driving unit (5), the upper-stage-side transformer (LH) corresponding to an upper-stage side of one of the arms (3A) and the lower-stage-side transformer (LL) corresponding to a lower-stage side, one end of a corresponding one of the primary-side coils (Lp) of the upper-stage-side transformer (LH) and one end of a corresponding one of the primary-side coils (Lp) of the lower-stage-side transformer (LL) be connected to a corresponding one of the first switching elements (51 (M1, M3, M5)), and another end of the corresponding one of the primary-side coils (Lp) of the upper-stage-side transformer (LH) and another end of the corresponding one of the primary-side coils (Lp) of the lower-stage-side transformer (LL) be connected to a corresponding one of the second switching elements (52 (M2, M4, M6)).

An upper-stage-side switching element (3H) and a lower-stage-side switching element (3L) of an arm (3A) for one alternating-current phase are disposed relatively close to each other in the inverter (10). Therefore, an upper-stage-side transformer (LH) and a lower-stage-side transformer (LL) are also disposed relatively close to each other. Since a first switching element (51 (M1, M3, M5)) and a second switching element (52 (M2, M4, M6)) can also be disposed close to the upper-stage-side transformer (LH) and the lower-stage-side transformer (LL), the wiring line distance between the transformer driving unit (5) and the transformers (L) can be reduced. As described above, current ripples occur in the primary side of the transformers (L), but by shortening the wiring lines, the distance at which ripple components propagate is reduced, and electromagnetic noise occurring due to the ripple components is also reduced.

In addition, in one aspect, it is preferred that each drive circuit (2) include an insulating element (51) that electrically isolates a low-voltage circuit (LV) including a control circuit (1) that generates switching control signals (SW) for driving the switching elements (3), from a high-voltage circuit (HV) including the inverter (10), and transmits a corresponding one of the switching control signals (SW), the upper-stage-side transformer (LH) and the lower-stage-side transformer (LL) for a same phase of alternating current be disposed adjacent to each other on a substrate (9), and corresponding ones of the insulating elements (51) for the upper-stage-side switching element (3H) and the lower-stage-side switching element (3L) for the phase be disposed on both sides in an arrangement direction with the upper-stage-side transformer (LH) and the lower-stage-side transformer (LL) sandwiched between the corresponding ones of the insulating elements (51).

By disposing an upper-stage-side transformer (LH) and a lower-stage-side transformer (LL) adjacent to each other, the wiring line distance between the transformer driving unit (5) and the transformers (L) can be reduced. In addition, since the transformers (L) supply electric power to the drive circuits (2), it is desirable that the transformers (L) and the drive circuits (2) be disposed in proximity to each other. By disposing the drive circuits (2) including the insulating elements (51) on both sides in an arrangement direction with the upper-stage-side transformer (LH) and the lower-stage-side transformer (LL) sandwiched between the drive circuits (2), the transformers (L) and the drive circuits (2) can be disposed in proximity to each other. In addition, the transformers (L) are an insulating parts, and can be connected, for example, in a state in which the low-voltage circuit (LV) in which the primary-side coils (Lp) are disposed is electrically isolated from the high-voltage circuit (HV) in which the secondary-side coils (Ls) are disposed. By disposing the transformers (L) and the insulating elements (51) side by side in the arrangement direction of the transformers (L), the low-voltage circuit (LV) and the high-voltage circuit (HV) are appropriately isolated from each other, and the transformers (L) and the insulating elements (51) can be efficiently disposed.

The invention claimed is:

1. A driving power supply device that supplies electric power to a plurality of drive circuits that individually drive a plurality of switching elements included in an inverter that converts electric power between direct current and alternating current of a plurality of phases, the driving power supply device comprising:
a plurality of transformers each including a primary-side coil and a secondary-side coil coupled to the primary-side coil in an electrically isolated state, the secondary-side coils being individually connected to the respective corresponding drive circuits;
a plurality of transformer driving units each including a driving switching element that is connected to a corresponding one of the primary-side coils and controls supply of electric power to the corresponding one of the primary-side coils; and
a power supply control device that provides transformer drive signals for driving the transformer driving units, wherein
the power supply control device drives the transformer driving units by the transformer drive signals having different phases.

2. The driving power supply device according to claim 1, wherein
m sets of the transformer driving units (m is a natural number greater than or equal to 2) are provided, each set of the transformer driving units being driven by the transformer drive signals having common change points, and
the sets of the transformer driving units are driven by the transformer drive signals whose phases are different by "360°/m" from each other.

3. The driving power supply device according to claim 2, wherein
each transformer driving unit includes a pair of the driving switching elements including a first switching element and a second switching element whose switching control is complementarily performed by a pair of the forward and reverse transformer drive signals having common change points,
when "360/m" is a divisor of 180, the sets of the transformer driving units are driven by pairs of the forward and reverse transformer drive signals whose phases are different by "180°/m" from each other, and
when "360/m" is other than a divisor of 180, the sets of the transformer driving units are driven by pairs of the forward and reverse transformer drive signals whose phases are different by "360°/m" from each other.

4. The driving power supply device according to claim 3, wherein the inverter converts electric power between n-phase alternating current (n is a natural number greater than or equal to 2) and direct current, and a number m of sets of the transformer driving units is n.

5. The driving power supply device according to claim 4, wherein
the inverter includes a plurality of arms each for one alternating-current phase, each arm being a series circuit of an upper-stage-side switching element connected to a positive polarity side of direct current and a lower-stage-side switching element connected to a negative polarity side of direct current,
each transformer driving unit includes a pair of the driving switching elements including a first switching element and a second switching element whose switching control is complementarily performed,
of the plurality of transformers, an upper-stage-side transformer and a lower-stage-side transformer for a same phase of alternating current are driven by the common transformer driving unit, the upper-stage-side transformer corresponding to an upper-stage side of one of the arms and the lower-stage-side transformer corresponding to a lower-stage side,
one end of a corresponding one of the primary-side coils of the upper-stage-side transformer and one end of a corresponding one of the primary-side coils of the lower-stage-side transformer are connected to a corresponding one of the first switching elements, and
another end of the corresponding one of primary-side coils of the upper-stage-side transformer and another end of the corresponding one of the primary-side coils of the lower-stage-side transformer are connected to a corresponding one of the second switching elements.

6. The driving power supply device according to claim 5, wherein
each drive circuit includes an insulating element that electrically isolates a low-voltage system circuit including a control circuit that generates switching control signals for driving the switching elements, from a high-voltage system circuit including the inverter, and transmits a corresponding one of the switching control signals, the upper-stage-side transformer and the lower-stage-side transformer for a same phase of alternating current are disposed adjacent to each other on a substrate, and corresponding ones of the insulating elements for the upper-stage-side switching element and the lower-stage-side switching element for the phase are disposed on both sides in an arrangement direction with the upper-stage-side transformer and the lower-stage-side transformer sandwiched between the corresponding ones of the insulating elements.

7. The driving power supply device according to claim 1, wherein the inverter includes a plurality of arms each for one alternating-current phase, each arm being a series circuit of an upper-stage-side switching element connected to a positive polarity side of direct current and a lower-stage-side switching element connected to a negative polarity side of direct current, each transformer driving unit includes a pair of the driving switching elements including a first switching element and a second switching element whose switching control is complementarily performed, of the plurality of transformers, an upper-stage-side transformer and a lower-stage-side transformer for a same phase of alternating current are driven by the common transformer driving unit, the upper-stage-side transformer corresponding to an upper-stage side of one of the arms and the lower-stage-side transformer corresponding to a lower-stage side, one end of a corresponding one of the primary-side coils of the upper-stage-side transformer and one end of a corresponding one of the primary-side coils of the lower-stage-side transformer are connected to a corresponding one of the first switching elements, and another end of the corresponding one of primary-side coils of the upper-stage-side transformer and another end of the corresponding one of the primary-side coils of the lower-stage-side transformer are connected to a corresponding one of the second switching elements.

8. The driving power supply device according to claim 7, wherein each drive circuit includes an insulating element that electrically isolates a low-voltage system circuit including a control circuit that generates switching control signals for driving the switching elements, from a high-voltage system circuit including the inverter, and transmits a corresponding one of the switching control signals, the upper-stage-side transformer and the lower-stage-side transformer for a same phase of alternating current are disposed adjacent to each other on a substrate, and corresponding ones of the insulating elements for the upper-stage-side switching element and the lower-stage-side switching element for the phase are disposed on both sides in an arrangement direction with the upper-stage-side transformer and the lower-stage-side transformer sandwiched between the corresponding ones of the insulating elements.

9. The driving power supply device according to claim 2, wherein the inverter converts electric power between n-phase alternating current (n is a natural number greater than or equal to 2) and direct current, and a number m of sets of the transformer driving units is n.

10. The driving power supply device according to claim 9, wherein the inverter includes a plurality of arms each for one alternating-current phase, each arm being a series circuit of an upper-stage-side switching element connected to a positive polarity side of direct current and a lower-stage-side switching element connected to a negative polarity side of direct current, each transformer driving unit includes a pair of the driving switching elements including a first switching element and a second switching element whose switching control is complementarily performed, of the plurality of transformers, an upper-stage-side transformer and a lower-stage-side transformer for a same phase of alternating current are driven by the common transformer driving unit, the upper-stage-side transformer corresponding to an upper-stage side of one of the arms and the lower-stage-side transformer corresponding to a lower-stage side, one end of a corresponding one of the primary-side coils of the upper-stage-side transformer and one end of a corresponding one of the primary-side coils of the lower-stage-side transformer are connected to a corresponding one of the first switching elements, and another end of the corresponding one of primary-side coils of the upper-stage-side transformer and another end of the corresponding one of the primary-side coils of the lower-stage-side transformer are connected to a corresponding one of the second switching elements.

11. The driving power supply device according to claim 10, wherein each drive circuit includes an insulating element that electrically isolates a low-voltage system circuit including a control circuit that generates switching control signals for driving the switching elements, from a high-voltage system circuit including the inverter, and transmits a corresponding one of the switching control signals, the upper-stage-side transformer and the lower-stage-side transformer for a same phase of alternating current are disposed adjacent to each other on a substrate, and corresponding ones of the insulating elements for the upper-stage-side switching element and the lower-stage-side switching element for the phase are disposed on both sides in an arrangement direction with the upper-stage-side transformer and the lower-stage-side transformer sandwiched between the corresponding ones of the insulating elements.

12. The driving power supply device according to claim 2, wherein the inverter includes a plurality of arms each for one alternating-current phase, each arm being a series circuit of an upper-stage-side switching element connected to a positive polarity side of direct current and a lower-stage-side switching element connected to a negative polarity side of direct current, each transformer driving unit includes a pair of the driving switching elements including a first switching element and a second switching element whose switching control is complementarily performed, of the plurality of transformers, an upper-stage-side transformer and a lower-stage-side transformer for a same phase of alternating current are driven by the common transformer driving unit, the upper-stage-side transformer corresponding to an upper-stage side of one of the arms and the lower-stage-side transformer corresponding to a lower-stage side, one end of a corresponding one of the primary-side coils of the upper-stage-side transformer and one end of a corresponding one of the primary-side coils of the lower-stage-side transformer are connected to a corresponding one of the first switching elements, and another end of the corresponding one of primary-side coils of the upper-stage-side transformer and another end of the corresponding one of the primary-side coils of the lower-stage-side transformer are connected to a corresponding one of the second switching elements.

13. The driving power supply device according to claim 12, wherein each drive circuit includes an insulating element that electrically isolates a low-voltage system circuit including a control circuit that generates switching control signals for driving the switching elements, from a high-voltage system circuit including the inverter, and transmits a corresponding one of the switching control signals, the upper-stage-side transformer and the lower-stage-side transformer for a same phase of alternating current are disposed adjacent to each other on a substrate, and corresponding ones of the insulating elements for the upper-stage-side switching element and the lower-stage-side switching element for the phase are disposed on both sides in an arrangement direction with the upper-stage-side transformer and the lower-stage-side transformer sandwiched between the corresponding ones of the insulating elements.

14. The driving power supply device according to claim 3, wherein the inverter includes a plurality of arms each for one alternating-current phase, each arm being a series circuit of an upper-stage-side switching element connected to a positive polarity side of direct current and a lower-stage-side switching element connected to a negative polarity side of direct current, each transformer driving unit includes a pair of the driving switching elements including a first switching element and a second switching element whose switching control is complementarily performed, of the plurality of transformers, an upper-stage-side transformer and a lower-stage-side transformer for a same phase of alternating current are driven by the common transformer driving unit, the upper-stage-side transformer corresponding to an upper-stage side of one of the arms and the lower-stage-side transformer corresponding to a lower-stage side, one end of a corresponding one of the primary-side coils of the upper-stage-side transformer and one end of a corresponding one of the primary-side coils of the lower-stage-side transformer are connected to a corresponding one of the first switching elements, and another end of the corresponding one of primary-side coils of the upper-stage-side transformer and another end of the corresponding one of the primary-side coils of the lower-stage-side transformer are connected to a corresponding one of the second switching elements.

15. The driving power supply device according to claim 14, wherein each drive circuit includes an insulating element that electrically isolates a low-voltage system circuit including a control circuit that generates switching control signals for driving the switching elements, from a high-voltage system circuit including the inverter, and transmits a corresponding one of the switching control signals, the upper-stage-side transformer and the lower-stage-side transformer for a same phase of alternating current are disposed adjacent to each other on a substrate, and corresponding ones of the insulating elements for the upper-stage-side switching element and the lower-stage-side switching element for the phase are disposed on both sides in an arrangement direction with the upper-stage-side transformer and the lower-stage-side transformer sandwiched between the corresponding ones of the insulating elements.

* * * * *